US010972695B2

(12) United States Patent
Benjaram

(10) Patent No.: US 10,972,695 B2
(45) Date of Patent: Apr. 6, 2021

(54) IMAGE SENSORS WITH REDUCED SIGNAL SAMPLING KICKBACK

(71) Applicant: SEMICONDUCTOR COMPONENTS INDUSTRIES, LLC, Phoenix, AZ (US)

(72) Inventor: Rajashekar Benjaram, Bangalore (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 55 days.

(21) Appl. No.: 16/460,746

(22) Filed: Jul. 2, 2019

(65) Prior Publication Data

US 2020/0389614 A1 Dec. 10, 2020

Related U.S. Application Data

(60) Provisional application No. 62/856,835, filed on Jun. 4, 2019.

(51) Int. Cl.
*H04N 3/14* (2006.01)
*H04N 5/335* (2011.01)
*H04N 5/378* (2011.01)
*H01L 27/146* (2006.01)

(52) U.S. Cl.
CPC ....... *H04N 5/378* (2013.01); *H01L 27/14603* (2013.01); *H01L 27/14609* (2013.01)

(58) Field of Classification Search
CPC .. H04N 5/378; H04N 5/3745; H04N 5/37452; H04N 5/357; H04N 5/3575; H01L 27/14609; H01L 27/14603
See application file for complete search history.

(56) References Cited

U.S. PATENT DOCUMENTS

2005/0285957 A1* 12/2005 Mutoh .................. H04N 5/357
348/300
2006/0221220 A1* 10/2006 Park ....................... H03F 1/342
348/294

(Continued)

OTHER PUBLICATIONS

Matsuo et al., 8.9-Megapixel Video Image Sensor With 14-b Column-Parallel SA-ADC, IEEE Transactions on Electron Devices, vol. 56, No. 11, Nov. 2009.

*Primary Examiner* — Kelly L Jerabek
(74) *Attorney, Agent, or Firm* — Treyz Law Group, P.C.; Tianyi He

(57) ABSTRACT

An image sensor may include an array of image pixels. The image pixel pixels may be arranged in columns and rows. Each column of image pixels may be coupled to column readout circuitry via respective column lines. The column readout circuitry may include amplifier circuitry, a first source follower stage, and a second source follower stage. The first and second source follower stages may be interposed between the amplifier circuitry and a sampling capacitor. A switch may be interposed between the first and second source follower stages. The second source follower transistor may be configured to provide an intermediate sampling voltage to the sampling capacitor. The first source follower transistor may be configured to provide a final sampling voltage to the sampling capacitor. In such a manner, kickback from sampling signals using readout circuitry may be reduced.

20 Claims, 6 Drawing Sheets

(56) References Cited

U.S. PATENT DOCUMENTS

| | | |
|---|---|---|
| 2009/0268072 A1* | 10/2009 | Makiyama ............. H04N 5/359 |
| | | 348/311 |
| 2010/0177220 A1 | 7/2010 | Kwon et al. |
| 2014/0368706 A1 | 12/2014 | Park et al. |
| 2017/0208283 A1* | 7/2017 | Moberg ................. H04N 5/359 |
| 2017/0289470 A1* | 10/2017 | Deng ................... H04N 5/3765 |
| 2019/0035834 A1 | 1/2019 | Kim et al. |

* cited by examiner

IMAGE SENSORS WITH REDUCED SIGNAL SAMPLING KICKBACK

CROSS-REFERENCE TO RELATED APPLICATIONS

This application claims the benefit of U.S. Provisional Patent Application No. 62/856,835, filed on Jun. 4, 2019, the entire contents of which is incorporated herein by reference.

BACKGROUND

This relates generally to imaging devices, and more particularly, to imaging devices that mitigate signal sampling kickback.

Image sensors are commonly used in electronic devices such as cellular telephones, cameras, and computers to capture images. In a typical arrangement, an electronic device is provided with an array of image pixels arranged in pixel rows and pixel columns. Readout circuitry is commonly coupled to each pixel column for reading out image signals from the image pixels.

The readout circuitry sample signals from the image pixels for storage at a sampling node. However, the sampling process as done by an amplifier or other readout circuitry components can cause kickback noise at the input of the amplifier, thereby undesirably adding additional phase delay onto (e.g., increasing settling time on) the signal path. It is similarly undesirable to provide additional current to improve line settling as this would increase current requirements, which may not be acceptable in some applications.

It would therefore be desirable to provide imaging devices with reduced signal sampling kickback.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
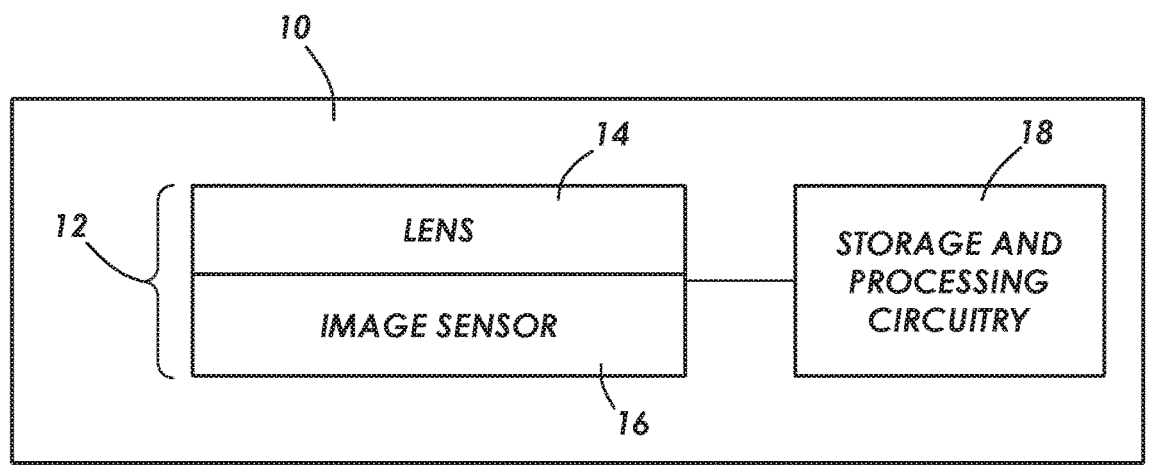
FIG. 1 is a diagram of an illustrative electronic device having an image sensor and processing circuitry for capturing images using an array of image pixels in accordance with some embodiments.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel signals into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
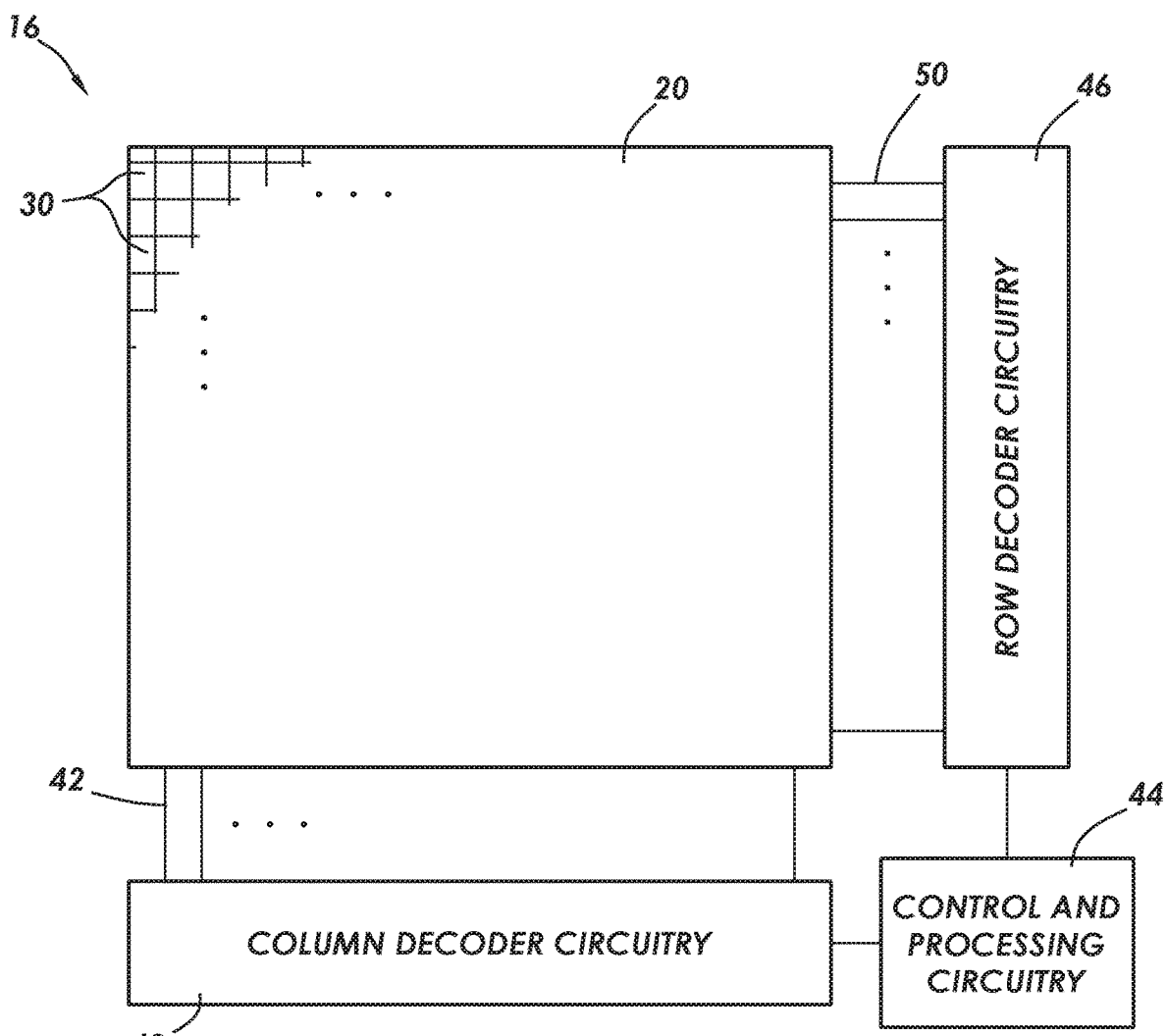
FIG. 2 is a diagram of an illustrative pixel array and associated readout circuitry for reading out image signals from the pixel array in accordance with some embodiments.

As shown in FIG. 2, image sensor 16 may include pixel array 20 containing image sensor pixels 30 (sometimes referred to herein as image pixels or pixels) arranged in rows and columns and control and processing circuitry 44 (which may include, for example, image signal processing circuitry). Pixel array 20 may contain, for example, hundreds or thousands of rows and columns of image sensor pixels 30. Control circuitry 44 may be coupled to row control circuitry 46 (sometimes referred to herein as row decoder circuitry or row circuitry) and column readout circuitry 48 (sometimes referred to herein as column control circuitry, readout circuitry, processing circuitry, or column decoder circuitry).

Row control circuitry 46 may receive row addresses from control circuitry 44 and supply corresponding row control signals such as reset, row-select, charge transfer, anti-blooming, dual conversion gain, and readout control signals to pixels 30 over row control lines 50. One or more conductive lines such as column lines 42 may be coupled to each column of pixels 30 in pixel array 20. Column lines 42 may be used for reading out image signals from pixels 30 and for supplying bias signals (e.g., bias currents, bias voltages, bias voltage levels, etc.) to pixels 30. If desired, during pixel readout operations, a pixel row in array 20 may be selected using row control circuitry 46 and image signals generated by image pixels 30 in that pixel row can be read out along column lines 42.

Column readout circuitry 48 may receive image signals (e.g., analog pixel values generated by pixels 30) over column lines 42. Image readout circuitry 48 may include sample and hold circuitry for sampling and temporarily storing image signals read out from pixel array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in pixel array 20 for operating pixels 30 and for reading out image signals from pixels 30. ADC circuitry in readout circuitry 48 may convert analog pixel values received from array 20 into corresponding digital pixel values (sometimes referred to as digital image data or digital pixel data). Image readout circuitry 48 may supply digital pixel data to control and processing circuitry 44 and/or processor 18 (FIG. 1) for pixels 30 in one or more pixel columns.

Pixel array 20 may be provided with a color filter array having multiple color filter elements, which allows a single image sensor to sample light of different colors. As an example, image sensor pixels such as image pixels 30 in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 30.

A microlens may be formed over an upper surface of the color filter array to focus incoming light onto the photosensitive region associated with that pixel 30. A microlens may be formed over an upper surface of the color filter array to focus incoming light onto the photosensitive region associated with that pixel 30.

Figure 3A:
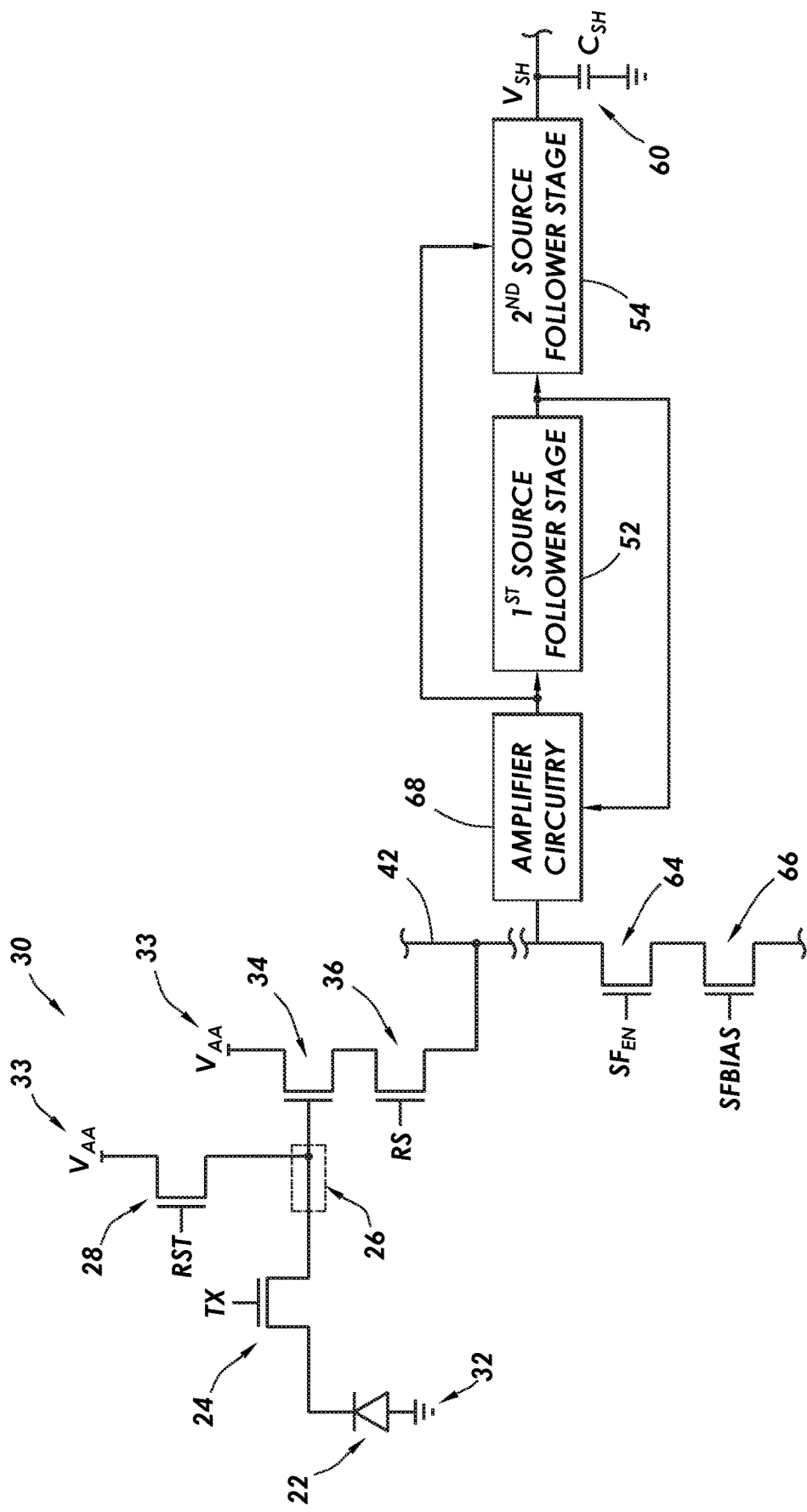
FIG. 3A is a diagram of an illustrative image sensor pixel coupled to readout circuitry with reduced signal sampling kickback in accordance with some embodiments.

Circuitry in an illustrative image pixel 30 and illustrative readout circuitry 48 of image sensor 16 is shown in FIG. 3A. As shown in FIG. 3A, pixel 30 may include a photosensitive element such as photodiode 22 (or photodetector 22). A positive pixel power supply voltage (e.g., voltage $V_{AA}$) may be supplied at positive power supply terminal 33. A ground power supply voltage (e.g., voltage Vss) may be supplied at ground supply terminal 32 (sometimes referred to herein as ground power supply terminal). Incoming light may be gathered by photodiode 22 after the incoming light passes through a color filter structure. Photodiode 22 may convert the light to electrical charge.

Reset control signal RST may be asserted to turn on reset transistor 28 and resets charge storage node 26 (also referred to as a floating diffusion or a floating diffusion region) to a reset voltage. Reset control signal RST may then be deasserted to turn off reset transistor 28 (e.g., asserted-low to deactivate the corresponding transistor). After an image acquisition process is complete, transfer gate control signal TX may be asserted to turn on transfer transistor 24. When transfer transistor 24 is turned on, the charge that has been generated by photodiode 22 in response to incoming light is transferred to charge storage node 26.

Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) may exhibit a capacitance that is used to store the charge that has been transferred from photodiode 22. The signal associated with the stored charge on node 26 may be buffered by source-follower transistor 34. Row select transistor 36 may connect the source follower transistor 34 to column output line 42 (sometimes referred to herein as a column line).

If desired, various types of image pixel circuitry may be used to implement the image pixels of image sensor 16. For example, each image sensor pixel 30 (see, e.g., FIG. 1) may be a three-transistor pixel, a pinned-photodiode pixel with four transistors, a global shutter pixel, a light-flickering mitigation enabled pixel, a dual conversion gain pixel, a phase detection pixel, or a pixel with any combination of these configurations and functionalities or other configurations and functionalities. The circuitry of FIG. 3A is merely illustrative. If desired, pixel 30 may include one or more photosensitive regions, one or more additional charge storage region (e.g., storage gates, capacitors), and one or more additional transistors that provide access to the one or more additional charge storage regions to form a pixel having the above-mentioned functionalities. As a particular example, pixel 30 may include an anti-blooming transistor coupled between photosensitive element 22 and supply terminal 33.

Still referring to FIG. 3A, transistors 64 and 66 may be provided along column output line 42. Transistor 64 may be an enable transistor that serves as a switch that enables column output line 42 when control signal $SF_{EN}$ is asserted (e.g., when performing pixel readout operations). Transistor 66 may be a bias transistor that serves as a current source for column output line 42 when a suitable bias signal SFBIAS is provided.

Additionally, (column) readout circuitry 48 (in FIG. 2) may be coupled to column line 42. As an example, column readout circuitry 48 may include amplifier circuitry 68 and source follower stage 52. In particular, amplifier 68 may sample (image level or reset level) pixel signals off of column line 42 for storage at sampling capacitor 60. However, sampling in such a manner exhibits undesirable kickback noise (e.g., a kickback voltage) at the input terminal of amplifier circuitry 68. As an example, when a sampling switch is activated or turned on to transfer an output of amplifier circuitry 68 to storage node $V_{SH}$, there will be charge sharing between the output capacitance of amplifier circuitry 68 and the sampling capacitance of capacitor 60. This leads to a change in the output voltage of amplifier circuitry 68 and introduce a kickback voltage at the input of amplifier circuitry (e.g., via a feedback path). Any such kickback will cause additional delay to the settling time of the signal path (e.g., column line 42). Furthermore, switching noise due to the kickback will introduce an addition source for column fixed-pattern noise.

To mitigate these issues, column readout circuitry 48 (in FIG. 2) may also include an additional source follower stage such as source follower stage 54 interposed between source follower stage 52 and sampling capacitor 60 (sometimes referred to herein as a charge storage structure). At least a portion of source follower stage 54 may be the same as a portion of source follower stage 52 to replicate the source follower characteristics of source follower stage 52. As examples, source follower stages 52 and 54 may both be formed from four transistors, formed from transistors using the same technology, formed form transistors coupled in the same relative manner, etc. If desired, the structure of source follower stage 52 may be the same as the structure of source follower stage 54.

Source follower stage 54 may charge the sampling capacitance such that sampling voltage node $V_{SH}$ (at a terminal of sampling capacitor 60) is at an intermediate sampling voltage (sometimes referred to herein as a coarse sampling voltage). Source follower stage 52 may subsequently charge the sampling capacitance such that sampling voltage node $V_{SH}$ is at a final sampling voltage.

In other words, source follower stage 52 may initially be disconnected from source follower stage 54 (e.g., via a turned-off switch). Amplifier circuitry 68 may convey an output signal directly to source follower stage 54 to perform a coarse sampling operation. Amplifier circuitry 68 may similarly convey the output signal directly to source follower stage 52. However, given that there is no direct path from source follower stage 52 to sampling capacitor 60 (e.g., because of the interposing turned-off switch), an output of source follower stage 52 only holds the final sampling voltage. Thereafter, the switch may connect source follower stage 52 to source follower stage 54, and the output of source follower stage 52 is connected to sampling voltage node $V_{SH}$, which receives the final sampling voltage.

Readout circuitry 48 (in FIG. 2) may perform any subsequently processing operations based on the sampled voltage (at sampling voltage node $V_{SH}$) as desired. If desired, $V_{SH}$ sampling voltage node may be coupled to analog to digital conversion circuitry downstream (e.g., readout circuitry 48 may perform analog to digital conversion operation based on the sampled voltage). If desired, readout circuitry 48 may convey the sampled voltage to control and processing circuitry 44 (in FIG. 2) and/or storage and processing circuitry 18 (in FIG. 1). The sampled voltage may be indicative of any type of signal (e.g., may be associated with any type of pixel signal) such as a reset level signal, an image level signal, a noise level signal, etc.

Figure 3B:
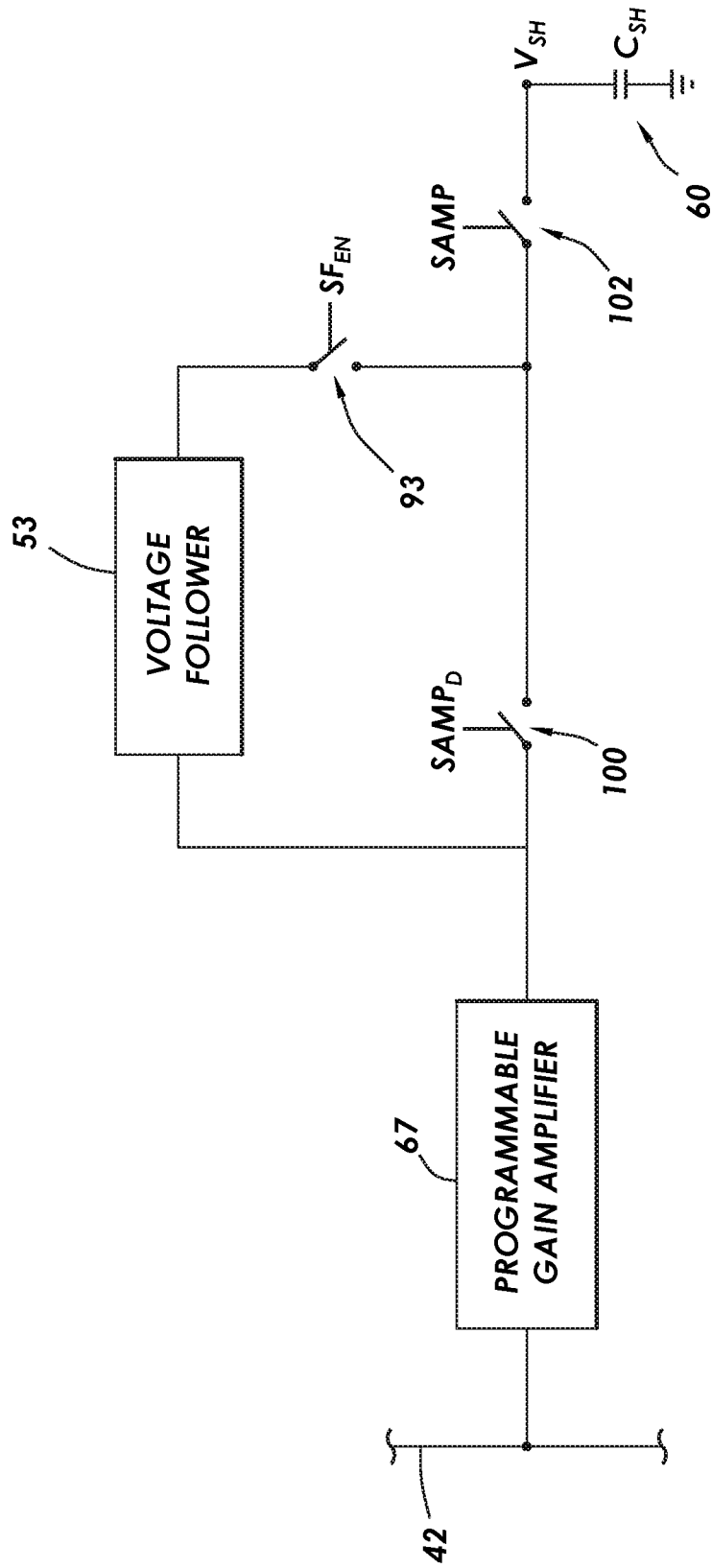
FIG. 3B is a diagram of illustrative circuitry having a programmable gain amplifier and a voltage follower configured to reduce signal sampling kickback in accordance with some embodiments.

While FIG. 3A shows amplifier circuitry 68 and source follower stages 52 and 54 coupled in a particular manner, this configuration is merely illustrative. As another example, FIG. 3B shows a different implementation and/or representation of amplifier circuitry and source follower circuitry. In particular, FIG. 3B shows programmable gain amplifier 67 having an input coupled to column line 42 and an output coupled to voltage follower 53 (e.g., similar to source follower stage 54 in FIG. 3A). Programmable gain amplifier 67 may include a switched-capacitor amplifier. The output of programmable gain amplifier 67 may be initially sampled using voltage follower 53 (e.g., by activating switches 93 and 102 and deactivating switch 100). Subsequently (e.g., to accurately sample the image signal after a coursing sampling using voltage follower 53), the output of programmable gain amplifier 67 may be sampled directly from programmable gain amplifier 67 (e.g., by activating switches 100 and 102 and deactivating switch 93) to overcome kickback from sampling voltage node $V_{SH}$ to amplifier output and to amplifier input.

If desired, programmable amplifier may include two stages, with a first operational amplifier stage (e.g., similar to amplifier circuitry 68 in FIG. 3A) and a second source follower stage (e.g., similar to source follower stage 52 in FIG. 3A). The operational amplifier stage may be implemented using a telescopic operational amplifier, a (five-transistor) operational transconductance amplifier, a folded cascode amplifier, and/or any other types of amplifiers. Programmable gain amplifier 67 may also be referred to herein as amplifier circuitry or programmable gain amplifier circuitry.

Figure 4:
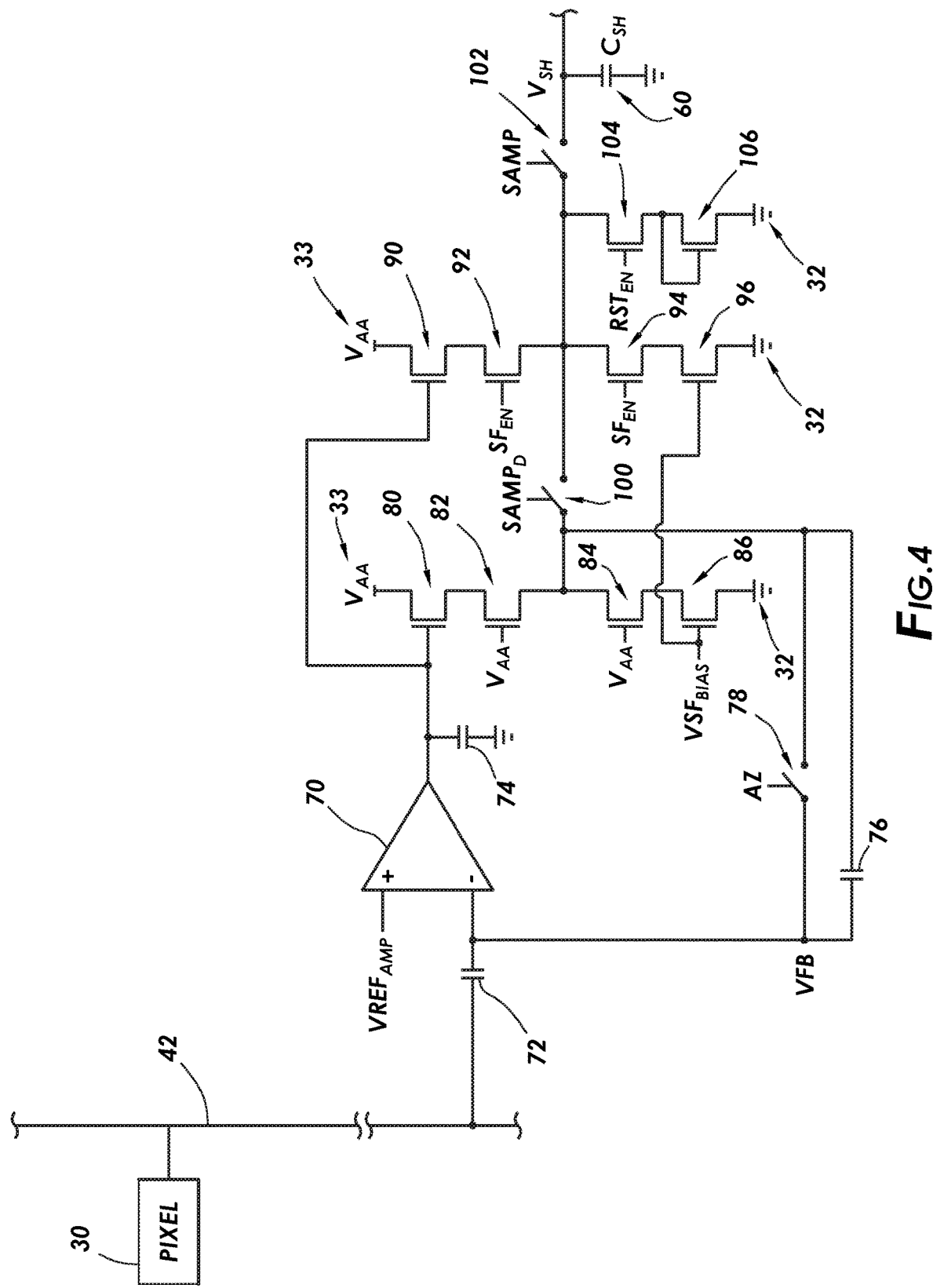
FIG. 4 is a circuit diagram of illustrative readout circuitry with reduced signal sampling kickback in accordance with some embodiments.

FIG. 4 is a circuit diagram showing an illustrative configuration for readout circuitry 48 that includes amplifier circuitry and two source follower stages. Details regarding the configuration of pixel 30 and other circuitry coupled to column line 42 as described in connection with FIGS. 3A and 3B are omitted in connection with FIG. 4 to not obscure the current amendments. Similar features in FIG. 4 corresponding to previously described features in FIGS. 3A and 3B may be assumed to function similarly, to serve similar purposes, etc.

In particular, amplifier circuitry 68 (in FIG. 3A) or programmable gain amplifier (in FIG. 3B) may include operational amplifier 70 having a first (non-inverting) input terminal and a second (inverting) input terminal. The non-inverting input terminal may receive reference voltage $VREF_{AMP}$. The inverting input terminal may be coupled to column line 42 via input capacitor 72. Amplifier 70 may include an output terminal coupled to output capacitor 76. The output terminal of amplifier 70 may be coupled to two source follower stages.

A first source follower stage (e.g., source follower stage 52 in FIG. 3A, a portion of programmable gain amplifier 67 in FIG. 3B) may include transistor 80, 82, 84, and 86 coupled in series between positive supply terminal 33 and ground supply terminal 32. The output terminal of amplifier 70 may be coupled to a gate terminal of transistor 80. A gate terminal of transistor 86 may receive bias voltage $VSF_{BIAS}$. Transistors 82 and 84 may receive supply voltage $V_{AA}$ at respective gate terminals of transistor 82 and 84.

The common source-drain terminals shared between transistors 82 and 84 may provide an output for first source follower stage 52. The output of first source follower stage 52 may be coupled to the inverting input terminal of amplifier 70 via a feedback path. Feedback capacitor 76 and Auto-zero switch 78 may be coupled in parallel along the feedback path.

A second source follower stage (e.g., source follower stage 54 in FIG. 3A, voltage follower 53 in FIG. 3B) may include transistors 90, 92, 94, and 96 coupled in series between positive supply terminal 33 and ground supply terminal 32. The output terminal of amplifier 70 may be coupled to a gate terminal of transistor 90. A gate terminal of transistor 96 may receive a bias voltage $VSF_{BIAS}$ (e.g., the same voltage signal received at the gate terminal of transistor 86). Transistor 92 and 94 may receive control signal $SF_{EN}$ at respective gate terminals of transistors 92 and 94.

The common source-drain terminals shared between transistors 92 and 94 may provide an output for second source follower stage 54. The output of second source follower stage 54 may be coupled to the output of first source follower stage 52 through switch 100 (sometimes referred to as switching circuitry or a switching circuit). Control signal $SAMP_D$ may control the state of switch 100. As an example, when control signal $SAMP_D$ is asserted, switch 100 may be in a conductive or on state, and when control signal $SAMP_D$ is deasserted, switch 100 may be in a non-conductive or off state. The output of second source follower stage 54 may be coupled to sampling voltage node $V_{SH}$ at a terminal of sampling capacitor 60 through switch 102. Control signal SAMP may control a state of switch 102 (sometimes referred to as switching circuitry or a switching circuit). As an example, when control signal SAMP is asserted, switch 102 may be in a conductive or on state, and when control signal SAMP is deasserted, switch 102 may be in a non-conductive or off state.

A biasing circuit may couple the output of second source follower stage 54 (e.g., the path connecting second source follower 54 to capacitor 60) to ground supply terminal 32. The biasing circuit may include reset enable transistor 104 coupled between the path connecting second source follower 54 to capacitor 60 and transistor 106. Transistor 106 may have a first source-drain terminal coupled to supply terminal 32 and a second source drain terminal coupled to its gate terminal. Configured as such, transistor 106 may provide a bias voltage to sampling voltage node $V_{SH}$ when transistor 104 and switch 102 are turned on (e.g., in a conductive state).

The circuit configuration in FIG. 4 forming amplifier circuitry and first and second source follower stages is merely illustrative. If desired, other circuitry (e.g., additional transistors, additional switches, etc.) may be used in addition to or instead of the circuits shown in FIG. 4 to implement the desired functionalities of amplifier circuitry and first and second source follower stages as described above in connection with FIGS. 3 and 4. If desired, one or more transistors and switches (e.g., transistors 104 and 106) may be omitted from the circuit configuration in FIG. 4.

Additionally, the readout circuits in FIGS. 3 and 4 are shown to be coupled to one column line. If desired, each column line may have a dedicated readout circuit of the type shown in FIG. 3 or 4. If desired, two or more column lines may share a readout circuit of the type shown in FIG. 3 or 4.

Figure 5:
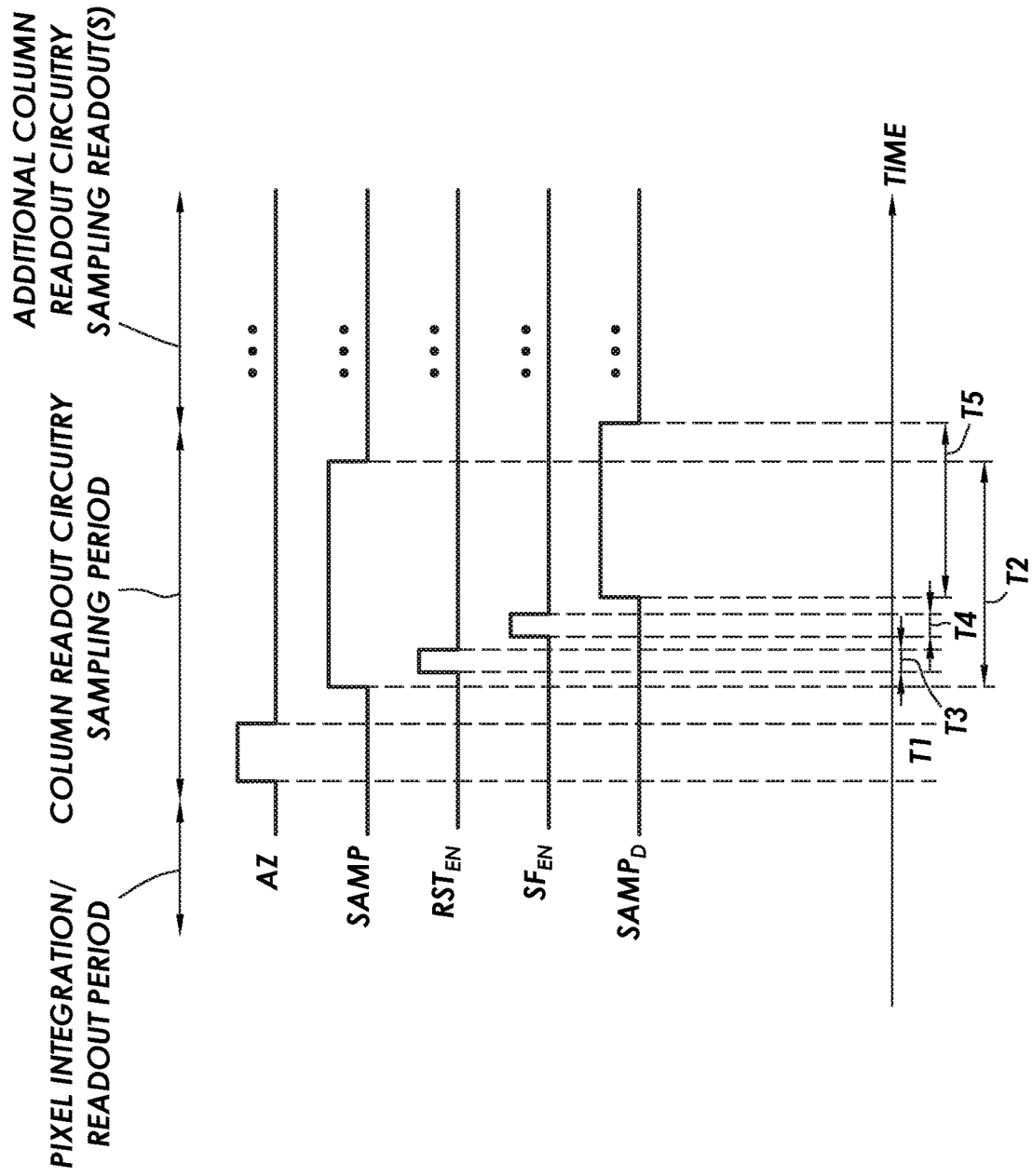
FIG. 5 is an illustrative timing diagram for operating readout circuitry of the type shown in FIG. 4 with reduced signal sampling kickback in accordance with an embodiment.

FIG. 5 shows an illustrative timing diagram for operating readout circuitry such as that of the type shown in FIGS. 3 and 4. As shown in FIG. 5, a column readout circuitry sampling period may occur following a pixel (array) integration and readout period. As an example, the pixel integrated and readout period may include a generation of image signals at photosensitive elements and a readout of the generated image signals through pixel transistors. The pixel readout period may also include the readout of reset level signals and/or noise signals, if desired.

To prepare for the sampling of signals from a pixel, during time period T1, control signal AZ for auto-zero switch 78 in FIG. 8 may be asserted to change switch 78 to a conductive state. This may short the inverting input terminal of amplifier 70 to the output of the first source follower stage.

During time period T2, control signal SAMP for switch 102 in FIG. 8 may be asserted to change switch 102 to a conductive state. This may connect sampling voltage node $V_{SH}$ to the second source follower stage and the biasing circuit (e.g., transistors 104 and 106).

While control signal SAMP remains asserted, control signal $RST_{EN}$ may be asserted to turn on the biasing circuit during time period T3. This may connect transistor 106 to sampling voltage node $V_{SH}$ and may provide a bias voltage (e.g., a bias voltage close to the threshold voltage of transistor 106) to sampling voltage node $V_{SH}$. The bias voltage conveyed to sampling voltage node $V_{SH}$ may be referred to as a reset voltage.

Thereafter, still while control signal SAMP remains asserted, control signal $SF_{EN}$ may be asserted to turn on transistors 92 and 94 in FIG. 4 and also transistor 64 in FIG. 3A. This may enable or activate the second source follower stage and convey an intermediate sampling voltage to sampling voltage node $V_{SH}$. The intermediate sampling voltage may be close to the final sampling voltage associated with sampled signal from the pixel. The intermediate sampling voltage may be between the bias voltage and the final sampling voltage. However, this is not necessary. If desired, the final sampling voltage may be between the bias voltage and the intermediate sampling voltage.

When control signal $SF_{EN}$ is asserted during time period T4, column line 42 (in FIG. 4) may be enabled and output of the first source follower stage (e.g., the common source-drain terminal of transistors 82 and 84) may be precharged to the final sampling voltage. As such, during time period T5, when control signal $SAMP_D$ is asserted (while control signal SAMP remains asserted), the final sampling voltage at the output of the first source follower stage may be conveyed to sampling voltage node $V_{SH}$ (through the second source follower stage). As such, the sampling capacitance at capacitor 60 may accurately reflect the sampled signal. The open loop charging of the second source follower stage may add additional noise due to the addition of the source follower transistor and the bias transistor. However, the effect of the additional noise may be reduced or minimized by performing the final sampling using the amplifier. This may be done by performing the final sampling by deasserting signal $SF_{EN}$. Since the noise of the second source follower stage is divided by the first stage amplifier gain, the associated sampling noise will be lower (when compared to using the second source follower stage for the final sampling).

If desired, additional column readout circuitry sampling periods may occur thereafter. As an example, the additional column readout circuitry sampling periods may include reset level signal sampling, when the first sampling period is associated with an image level signal sampling, or vice versa. As another example, the additional column readout circuitry sampling periods may include sampling for other rows of pixels.

Figure 6:
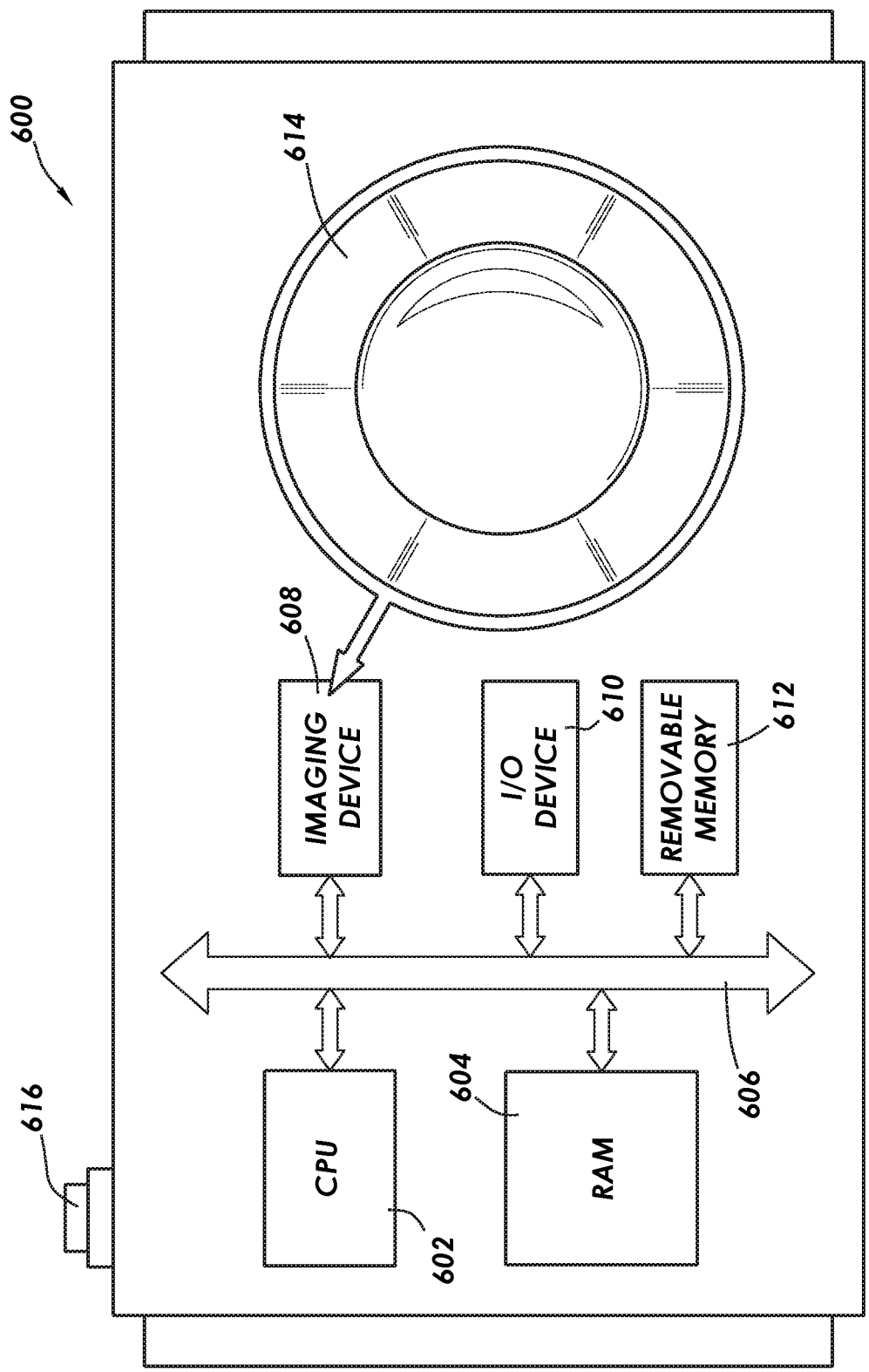
FIG. 6 is a block diagram of a processor system employing the embodiments of FIGS. 1-5 in accordance with an embodiment.

FIG. 6 is a simplified diagram of an illustrative processor system 600, such as a digital camera, which includes an imaging device 608 (e.g., camera module 12 of FIG. 1) employing an image sensor as described above in connection with FIGS. 1-5. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 600, for example a digital still or video camera system, generally includes a lens 614 for focusing an image onto one or more pixel array in imaging device 608 (optionally when a shutter release button 616 is pressed) and a central processing unit (CPU) 602 such as a microprocessor which controls camera and one or more image flow functions. Processing unit 602 can communicate with one or more input-output (I/O) devices 610 over a system bus 606. Imaging device 608 may also communicate with CPU 602 over bus 606. System 600 may also include random access memory (RAM) 604 and can optionally include removable memory 612, such as flash memory, which can also communicate with CPU 602 over the bus 606. Imaging device 608 may be combined with the CPU, with or without memory storage on a single integrated circuit or on a different chip. Although bus 606 is illustrated as a single bus, it may be one or more busses, bridges or other communication paths used to interconnect system components of system 600.

Various embodiments have been described illustrating systems with and methods for image sensors configured with reduced signal sampling kickback.

In some embodiments, an image sensor may include an image pixel operable to generate a signal. Readout circuitry may sample the signal and may include amplifier circuitry, a first source of follower stage, a second source follower stage, and a charge storage structure (e.g., sampling capacitor) operable to store the sampled signal. The first and second source follower stages may be interposed between the amplifier circuitry and the charge storage structure. The amplifier circuitry may have an output terminal that is directly coupled the first source follower stage and directly coupled to the second source follower stage. The first and second source follower stages may respectively include first and second sets of transistors connected in series between corresponding positive and ground supply terminals. Two respective transistors in the first and second sets of transistors may each have a gate terminal that is coupled to the output terminal of the amplifier circuitry. Two transistors in the first set of transistors may share a common source-drain terminal. Two transistors in the second set of transistors may share a common source-drain terminal. A first switch may couple the first source follower stage to the second source follower stage, and a second switch may couple the second source follower stage to the charge storage structure. In particular, the first switch may couple the common source-drain terminal in the first set of transistors to the common source-drain terminal in the second set of transistors. A biasing circuit may be operable to provide a bias (reset) voltage to the charge storage structure through the additional switch. The amplifier circuitry may include an input terminal that is coupled to a column line connected to the image pixel. The common source-drain terminal may be coupled to the input terminal of the amplifier circuitry.

In some embodiments, a method of operating readout circuitry coupled to an image sensor using a column line may include: with amplifier circuitry, receiving a signal from the image sensor pixel using the column line; with a first source follower stage, providing an intermediate (coarse) sampling voltage associated with the signal to a sampling voltage node (at a terminal of a sampling capacitor); with a second source follower stage, providing a final sampling voltage associated with the signal to the sampling voltage node after providing the intermediate sampling voltage. The method may further include: activating (i.e., turning on, putting into a conductive state) a switch interposed between the source follower stage and the sampling voltage node; while the switch is activated, enabling a biasing circuit to provide a reset voltage to the sampling voltage node; while the switch is activated, activating the source follower stage by asserting at least one control signal for at least one transistor in the source follower stage; while the switch is activated, activating an additional switch interposed between the additional source follower stage and the source follower stage.

In some embodiments, an imaging system may include processing circuitry, an image sensor array, and column readout circuitry coupled to the image sensor pixel array via at least one column line. The column readout circuitry may include a charge storage structure operable to store signals sampled from the column line, a biasing circuit operable to provide a bias voltage to the charge storage structure, a set of transistors coupled in series and operable to provide a coarse sampling voltage to the charge storage structure, and an additional set of transistors coupled in series and operable to provide a final sampling voltage to the charge storage structure. A switching circuit (e.g., a switch) may be interposed between the set of transistors and the additional set of transistors. The additional set of transistors may be operable to provide the final sampling voltage through the switching circuit. An additional switching circuit (e.g., an additional switch) may be interposed between the additional set of transistors and the charge storage structure. The bias voltage, the coarse sampling voltage, and the final sampling voltage may all be provided through the additional switching circuit.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising:
    an image pixel; and
    readout circuitry coupled to the image pixel and configured to sample a signal from the image pixel, the readout circuitry comprising:
        amplifier circuitry;
        a first source follower stage;
        a second source follower stage;
        a charge storage structure configured to store a voltage associated with the sampled signal, wherein the first and second source follower stages are coupled between the amplifier circuitry and the charge storage structure; and
        a switch that couples the first source follower stage to the charge storage structure.

2. The image sensor defined in claim 1, wherein the amplifier circuitry comprises an output terminal, and wherein the output terminal is coupled to the first source follower stage and is coupled to the second source follower stage.

3. The image sensor defined in claim 2, wherein the first source follower stage comprises a set of transistors connected in series between first and second supply terminals.

4. The image sensor defined in claim 3, wherein the second source follower stage comprises an additional set of transistors connected in series between third and fourth supply terminals.

5. The image sensor defined in claim 4, wherein a first transistor in the set of transistors has a gate terminal coupled to the output terminal of the amplifier circuitry, and wherein a second transistor in the additional set of transistors has a gate terminal coupled to the output terminal of the amplifier circuitry.

6. The image sensor defined in claim 1, wherein
    the switch couples the first source follower stage to the second source follower stage.

7. The image sensor defined in claim 1, wherein the readout circuitry comprises:
    an additional switch that couples the second source follower stage to the charge storage structure.

8. The image sensor defined in claim 7, wherein the readout circuitry comprises:
    a biasing circuit configured to provide a bias voltage to the charge storage structure through the additional switch.

9. The image sensor defined in claim 1, wherein the amplifier circuitry comprises an input terminal coupled to a column line connected to the image pixel and an output terminal coupled to a gate terminal of a first transistor in the first source follower stage.

10. The image sensor defined in claim 9, wherein the first source follower stage includes second and third transistors coupled in series with the first transistor, and a common source-drain terminal of the second and third transistors is coupled to the input terminal of the amplifier circuitry.

11. The image sensor defined in claim 10, wherein the second source follower stage includes fourth and fifth transistors coupled in series, and a common source-drain terminal of the fourth and fifth transistors is coupled to the common source-drain terminal of the second and third transistors.

12. A method of operating readout circuitry coupled to an image sensor pixel using a column line, the method comprising:
- with amplifier circuitry in the readout circuitry, receiving a signal from the image sensor pixel using the column line;
- with a source follower stage coupled to the amplifier circuitry, providing an intermediate sampling voltage associated with the signal to a sampling voltage terminal by activating a switch coupled between the source follower stage and the sampling voltage terminal; and
- with an additional source follower stage coupled to the amplifier circuitry, providing a final sampling voltage associated with the signal to the sampling voltage terminal after providing the intermediate sampling voltage with the source follower stage.

13. The method defined in claim 12, further comprising:
- enabling a biasing circuit to provide a reset voltage to the sampling voltage terminal.

14. The method defined in claim 12, further comprising:
- while the switch is activated, activating the source follower stage by asserting at least one control signal for at least one transistor in the source follower stage.

15. The method defined in claim 12, wherein providing the final sampling voltage associated with the signal to the sampling voltage terminal comprises activating the switch.

16. An imaging system comprising:
- processing circuitry;
- an image sensor pixel array; and
- column readout circuitry coupled to the image sensor pixel array via at least one column line, wherein the column readout circuitry comprises:
  - a charge storage structure operable to store signals sampled from the column line;
  - a biasing circuit operable to provide a bias voltage to the charge storage structure;
  - a set of transistors coupled in series and operable to provide a coarse sampling voltage to the charge storage structure; and
  - an additional set of transistors coupled in series and operable to provide a final sampling voltage to the charge storage structure.

17. The imaging system defined in claim 16, wherein the column readout circuitry comprises:
- a switching circuit interposed between the set of transistors and the additional set of transistors, wherein the additional set of transistors is operable to provide the final sampling voltage through the switching circuit.

18. The imaging system defined in claim 17, wherein the column readout circuitry comprises:
- an additional switching circuit interposed between the additional set of transistors and the charge storage structure, wherein the biasing circuit is operable to provide the bias voltage through the additional switching circuit, wherein the set of transistors is operable to provide the coarse sampling voltage through the additional switching circuit, and wherein the additional set of transistors is operable to provide the final sampling voltage through the additional switching circuit.

19. The imaging system defined in claim 18, wherein the column readout circuitry comprises:
- an amplifier having an output terminal coupled to a gate terminal of a first transistor in the set of transistors and coupled to a gate terminal of a second transistor in the additional set of transistors.

20. The imaging system defined in claim 16, wherein the set of transistors is coupled between a positive supply terminal and a ground supply terminal, and wherein the additional set of transistors is coupled between an additional positive supply terminal and an additional ground supply terminal.

* * * * *